(12) United States Patent
Xie et al.

(10) Patent No.: US 10,446,653 B2
(45) Date of Patent: Oct. 15, 2019

(54) TRANSISTOR-BASED SEMICONDUCTOR DEVICE WITH AIR-GAP SPACERS AND GATE CONTACT OVER ACTIVE AREA

(71) Applicant: GLOBALFOUNDRIES Inc., Grand Cayman (KY)

(72) Inventors: Ruilong Xie, Schenectady, NY (US); Min Gyu Sung, Latham, NY (US); Chanro Park, Clifton Park, NY (US); Lars Wolfgang Liebmann, Mechanicville, NY (US); Hoon Kim, Horseheads, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 18 days.

(21) Appl. No.: 15/351,893

(22) Filed: Nov. 15, 2016

(65) Prior Publication Data
US 2018/0138279 A1    May 17, 2018

(51) Int. Cl.
| H01L 29/417 | (2006.01) |
| H01L 29/66 | (2006.01) |
| H01L 29/772 | (2006.01) |
| H01L 29/49 | (2006.01) |
| H01L 29/78 | (2006.01) |
| H01L 21/768 | (2006.01) |

(52) U.S. Cl.
CPC .. *H01L 29/41775* (2013.01); *H01L 21/76897* (2013.01); *H01L 29/4991* (2013.01); *H01L 29/6653* (2013.01); *H01L 29/6656* (2013.01); *H01L 29/772* (2013.01); *H01L 29/78* (2013.01); *H01L 21/7682* (2013.01)

(58) Field of Classification Search
CPC .......... H01L 29/41775; H01L 29/6656; H01L 29/772; H01L 29/6653; H01L 29/808; H01L 29/8611; H01L 21/768
See application file for complete search history.

(56) References Cited

U.S. PATENT DOCUMENTS

| 5,915,182 A * | 6/1999 | Wu | H01L 21/2652 |
| | | | 257/E21.151 |
| 6,297,109 B1 * | 10/2001 | Chan | H01L 21/28044 |
| | | | 257/E21.198 |
| 6,596,599 B1 * | 7/2003 | Guo | H01L 21/28114 |
| | | | 257/E21.205 |
| 7,741,663 B2 | 6/2010 | Hause et al. | |
| 8,124,531 B2 | 2/2012 | Chandrashekar et al. | |
| 8,637,930 B2 * | 1/2014 | Ando | H01L 29/785 |
| | | | 257/347 |

(Continued)

*Primary Examiner* — Dale E Page
*Assistant Examiner* — Quovaunda Jefferson
(74) *Attorney, Agent, or Firm* — Thompson Hine LLP; Francois Pagette (57) ABSTRACT

A semiconductor structure includes a semiconductor substrate, a semiconductor fin on the semiconductor substrate, a transistor integrated with the semiconductor fin at a top portion thereof, the transistor including an active region including a source, a drain and a channel region therebetween. The semiconductor structure further includes a gate structure over the channel region, the gate structure including a gate electrode, an air-gap spacer pair on opposite sidewalls of the gate electrode, and a gate contact for the gate electrode. A method of fabricating such a semiconductor device is also provided.

13 Claims, 6 Drawing Sheets

(56) References Cited

U.S. PATENT DOCUMENTS

| | | | |
|---|---|---|---|
| 2007/0184615 A1* | 8/2007 | Brazzelli | H01L 21/764 438/266 |
| 2010/0055904 A1 | 3/2010 | Chen et al. | |
| 2010/0102363 A1 | 4/2010 | Hause et al. | |
| 2012/0104512 A1* | 5/2012 | Horak | H01L 29/4983 257/401 |
| 2013/0049132 A1* | 2/2013 | Doris | H01L 21/7682 257/383 |
| 2013/0093019 A1* | 4/2013 | Ando | H01L 29/66803 257/347 |
| 2013/0307032 A1 | 11/2013 | Kamineni et al. | |
| 2014/0138779 A1* | 5/2014 | Xie | H01L 29/66545 257/401 |

* cited by examiner

TRANSISTOR-BASED SEMICONDUCTOR DEVICE WITH AIR-GAP SPACERS AND GATE CONTACT OVER ACTIVE AREA

BACKGROUND OF THE INVENTION

Technical Field

The present invention generally relates to semiconductor device fabrication strategies with favorable downward scaling. More particularly, the present invention relates to favorably incorporating both air-gap spacers and gate contact placement over the active area of transistor-based semiconductor devices.

Background Information

In general, strategies for downward scaling (i.e., shrinking) of semiconductor devices are needed in the semiconductor industry. For example, air-gap spacers (low-k) provide a capacitance reduction over conventional spacers, leading to increased performance. As another example, situating the gate contact over the active area promises downward scaling benefits. Although both air-gap spacers and gate-contact-over-active-area have desirable benefits for semiconductor devices as they continue to shrink in size, they are conventionally considered incompatible, due to the potential for interaction between the gate contact and the air-gap spacers, and between the source/drain contacts and the air-gap spacers.

SUMMARY OF THE INVENTION

Thus, a need continues to exist for fabrication strategies with favorable downward scaling going forward.

The shortcomings of the prior art are overcome and additional advantages are provided through the provision, in one aspect, of a method of fabricating transistors. The method comprises providing a starting semiconductor structure, the starting semiconductor structure comprising a semiconductor substrate, a fin on the substrate, an active region having a source/drain pair with a channel region therebetween, a lower contact portion above a source and a drain of the source/drain pair, and a gate electrode over the channel region. The method further comprises forming an air-gap spacer pair adjacent opposite sidewalls of the gate electrode, each air-gap spacer of the air-gap spacer pair comprising an air gap that is surrounded on all sides, top and bottom by a same spacer material. The method further comprises forming a lower gate contact over the gate electrode, and forming an upper gate contact over the lower gate contact, the upper gate contact being situated above the active region.

In another aspect, a semiconductor structure is provided, the semiconductor structure comprising a semiconductor substrate, a semiconductor fin on the semiconductor substrate, a transistor integrated with the semiconductor fin at a top portion thereof, the transistor comprising an active region comprising a source, a drain and a channel region therebetween, a gate structure over the channel region, the gate structure comprising a gate electrode, an air-gap spacer pair on opposite sidewalls of the gate electrode, each air-gap spacer of the air-gap spacer pair comprising an air gap that is surrounded on all sides, top and bottom by a same spacer material, and a gate contact for the gate electrode.

These, and other objects, features and advantages of this invention will become apparent from the following detailed description of the various aspects of the invention taken in conjunction with the accompanying drawings.

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value. Also, where used, the term "low-k dielectric" refers to a dielectric with a dielectric constant k<3.9. As used herein, the term "air-gap spacer" refers to a spacer for a gate electrode having therein an air gap encased by the material of the spacer.

Reference is made below to the drawings, which are not drawn to scale for ease of understanding, wherein the same reference numbers are used throughout different figures to designate the same or similar components.

Figure 1:
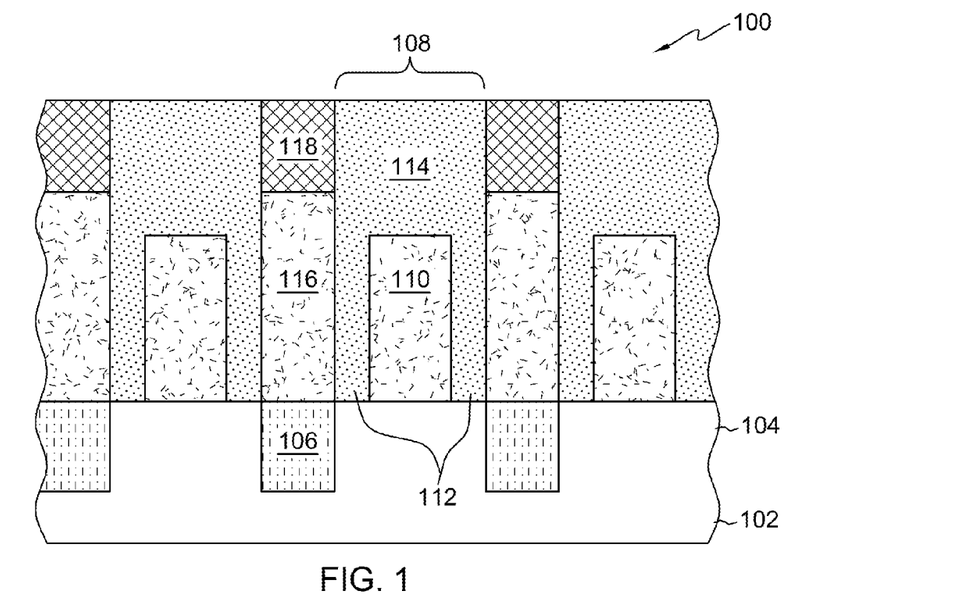
FIG. 1 is a cross-sectional view, taken across a fin, of one example of a starting semiconductor structure, the starting semiconductor structure including a semiconductor substrate, at least one fin over the substrate, source/drain regions, one or more gate structures including one or more gate electrodes, one or more spacer pairs and one or more gate caps, the one or more gate structures being separated by lower source/drain contacts, with one or more dielectric caps thereover, in accordance with one or more aspects of the present invention.

FIG. 1 is a cross-sectional view, taken along a fin, and across gates, of one example of a starting semiconductor structure 100, the starting semiconductor structure including a semiconductor substrate 102, at least one fin 104 over the substrate, source/drain regions 106, one or more gate structures 108 including one or more gate electrodes 110, one or more spacer pairs 112 and one or more gate caps 114, the one or more gate structures being separated by lower source/drain contacts 116, with one or more dielectric caps 118 thereover, in accordance with one or more aspects of the present invention.

The material(s) of the gate electrode(s) 110 may include, for example, one or more work-function-altering metals and/or composites. In one example, the work-function-altering metals and/or composites may include, for example, one or more of TiN, TaN, TiAl, TiAlC, TiC, W and/or Co. The material of the gate caps 114 may include, for example, SiN, SiBCN, SiOCN or SiOC. The material of the lower source/drain contacts 116 may include, for example, a bottom portion of silicide with a top portion of a conductive metal (e.g., Co or W). The material of the dielectric caps 118 over the lower source/drain contacts may include, for example, an oxide (e.g., $SiO_2$).

The starting structure may be conventionally fabricated, for example, using known processes and techniques. However, although only a portion is shown for simplicity, it will be understood that, in practice, many such structures are typically included on the same substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Figure 2:
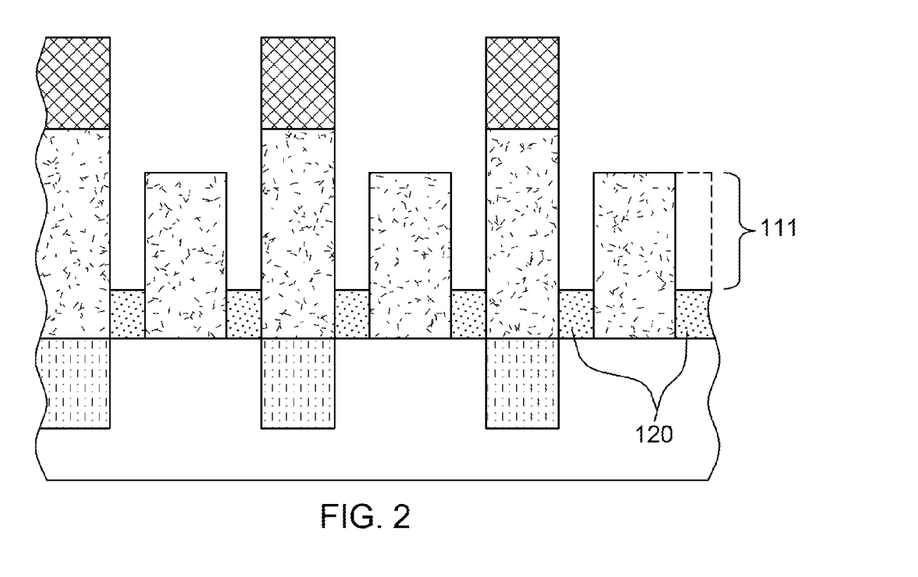
FIG. 2 depicts one example of the structure of FIG. 1 after removing each gate cap and upper spacer pair portions of each spacer pair, resulting in remaining lower spacer pair portions, in accordance with one or more aspects of the present invention.

FIG. 2 depicts one example of the structure of FIG. 1 after removing each gate cap 114 and upper spacer pair portions 111 of each spacer pair 112, resulting in remaining lower spacer pair portions 120, in accordance with one or more aspects of the present invention.

Preferably, the spacer pairs 112 are fully removed. However, in practice, fully removing the spacer pairs carries a risk of damaging fin 104, so a remaining portion of the spacer pairs is shown.

Figure 3:
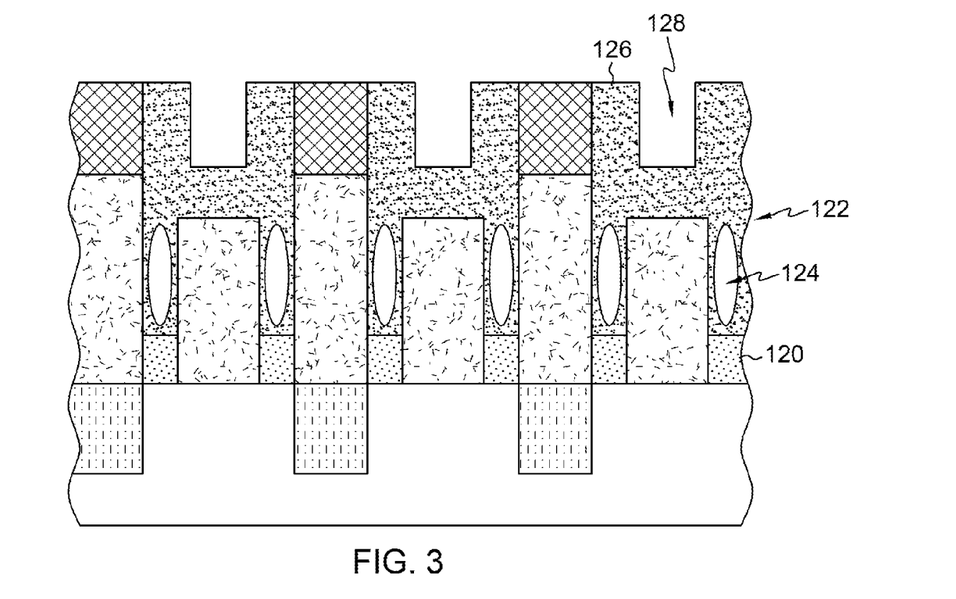
FIG. 3 depicts one example of the structure of FIG. 2 after forming at least one air-gap spacer pair, each of the at least one air-gap spacer pair including air gaps therein, a gate cap for each gate electrode, each gate cap having a trench therein, in accordance with one or more aspects of the present invention.

FIG. 3 depicts one example of the structure of FIG. 2 after forming at least one air-gap spacer pair 122, each of the at least one air-gap spacer pair including air gaps 124 therein, a gate cap 126 for each gate electrode 110, each gate cap having a trench 128 therein, in accordance with one or more aspects of the present invention.

In one example, the air-gap spacer pairs may be realized using a chemical-vapor deposition (CVD) process and pinch-off. Note that in practice, pinch-off with an air gap inside using the CVD process will happen relatively quickly as compared to the area above the gate cap, which is left not fully filled, such that the trenches are unfilled portions of that area.

Figure 4:
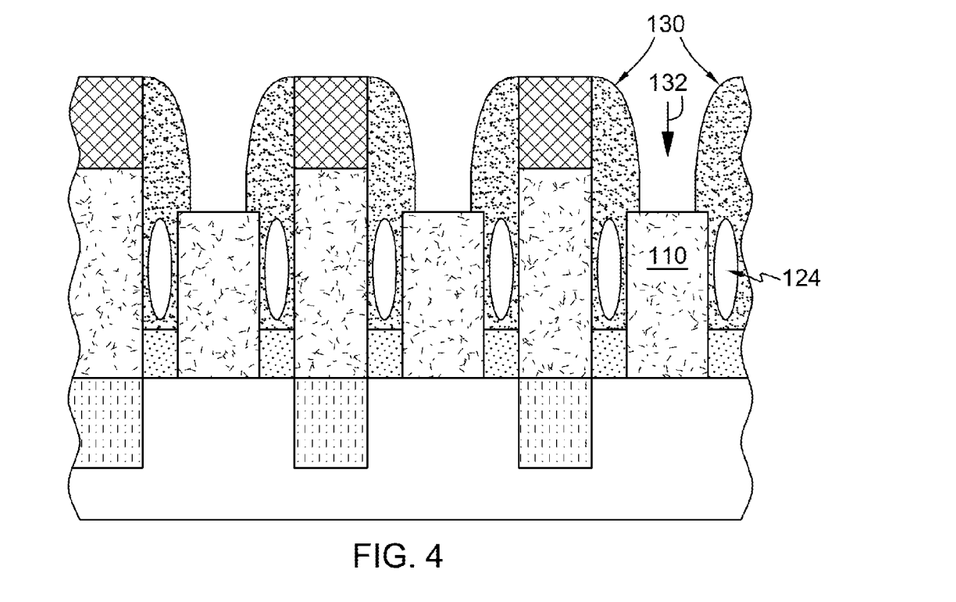
FIG. 4 depicts one example of the structure of FIG. 3 after exposing the gate electrode of each of the one or more gate structures under each corresponding trench (FIG. 3), the exposing resulting in exposed gate electrodes, upwardly extended and sloped spacer sidewalls above the air gaps and gate contact openings, in accordance with one or more aspects of the present invention.

FIG. 4 depicts one example of the structure of FIG. 3 after exposing the gate electrode 110 of each of the one or more gate structures under each corresponding trench 128 (FIG. 3). In one example, exposing the gate electrode(s) may be accomplished by applying an anisotropic etch process to material 126, the exposing resulting in exposed gate electrodes 110, upwardly extended and sloped spacer sidewalls 130 above the air gaps 124 and gate contact openings 132, in accordance with one or more aspects of the present invention.

Figure 5:
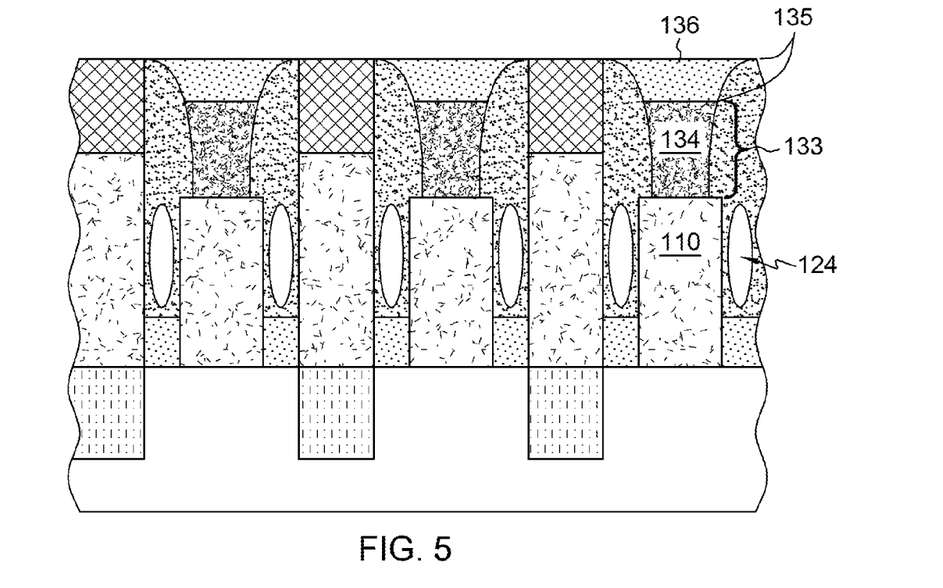
FIG. 5 depicts one example of the structure of FIG. 4 after selectively filling a bottom portion of the gate contact openings (FIG. 4) with metal on the gate electrodes (e.g., tungsten on tungsten or cobalt), filling a remaining portion of the gate contact openings with a hard mask material (e.g., silicon nitride), resulting in gate caps, and planarizing the structure, in accordance with one or more aspects of the present invention.

FIG. 5 depicts one example of the structure of FIG. 4 after selectively filling a bottom portion 133 of the gate contact openings (132, FIG. 4) with metal 134 on the gate electrodes 110 (e.g., tungsten on tungsten or cobalt), filling a remaining portion 135 of the gate contact openings with a hard mask material (e.g., silicon nitride), resulting in gate caps 136, and planarizing the structure, in accordance with one or more aspects of the present invention.

Figure 6:
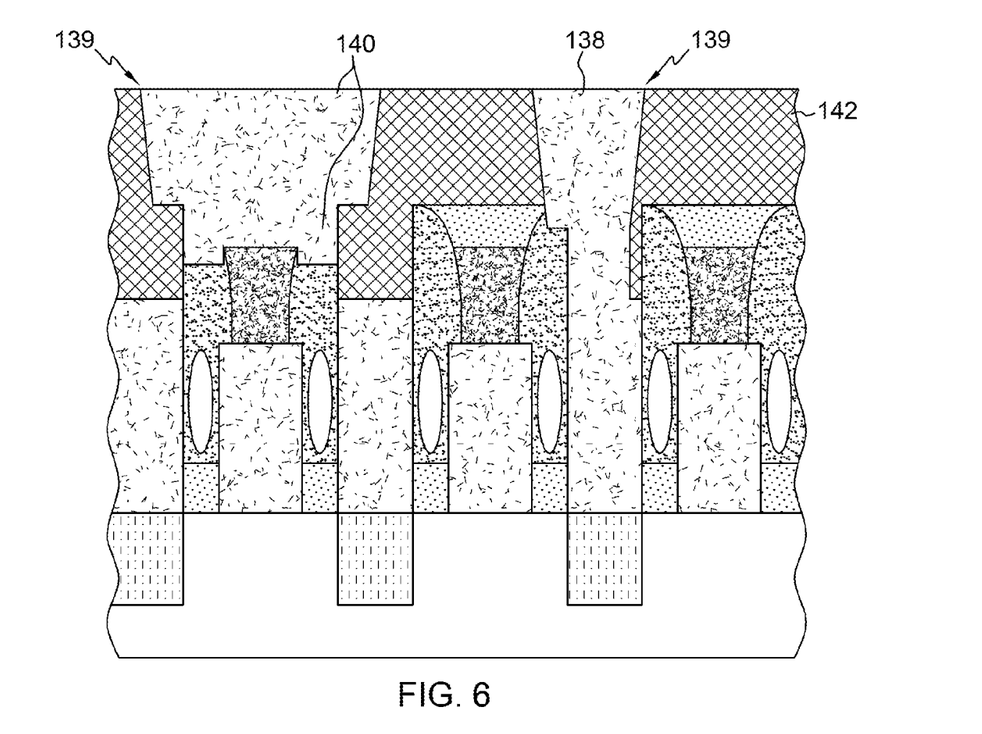
FIG. 6 depicts one example of the structure of FIG. 5 after forming a dielectric layer over the planarized structure, removing portions of the dielectric layer to form contact openings, forming source/drain contacts and gate contacts in the contact openings, and planarizing the structure, in accordance with one or more aspects of the present invention.

FIG. 6 depicts one example of the structure of FIG. 5 after forming a dielectric layer 142 over the planarized structure, removing portions of the dielectric layer to form upper source/drain contact openings 139, forming upper source/drain contacts 138 and gate contacts 140 in the contact openings, and planarizing the structure, in accordance with one or more aspects of the present invention.

In one example, different etch processes are used for upper source/drain contacts 138 and gate contact(s) 140. For example, the source/drain contacts may be formed using an etching process for dielectric layer 142, exposing the lower source/drain contacts (FIG. 1, 116) and stopping on a top surface of the lower source/drain contacts. The gate contact(s) may be realized by, for example, using a selective gate cap open process that does not damage the dielectric caps (FIG. 1, 118) over the lower source/drain contacts. This prevents an electrical short between the gate contact and the bottom source/drain contact. The upper source/drain contact openings may be realized using, for example, a selective etch process for the openings in dielectric layer 142 and the lower source/drain contacts, selective to the material(s) of the gate cap(s) and spacers (e.g., SiN).

Note that using selective metal growth over the gate electrodes 110 (see FIG. 5 and description above for metal 134), the upper source/drain contacts 138 and gate contact(s) 140 are effectively kept away from the air gaps 124. Without metal 134, the lower source/drain contacts would need to be recessed relatively deeply to prevent gate contact(s) 140 from electrically shorting with the lower source/drain contacts, as well as preventing contact of the upper source/drain contacts and the gate contact with the air gaps.

In practice, less than all of the upper gate contacts are present at the stage of FIG. 6, because not all the upper source/drain contacts are formed at the same level. The point of FIG. 6 is to illustrate that both the gate contact(s) and the upper source/drain contacts can be situated above the active region, without resulting in an electrical short therebetween or an electrical short with the gate or lower source/drain contacts.

Figure 7:
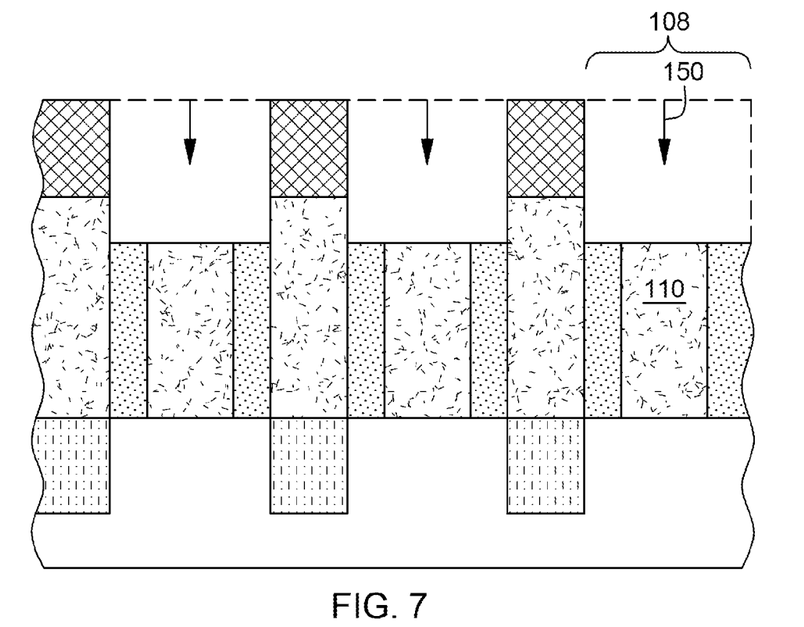
FIG. 7 depicts one example of the structure of FIG. 1 after recessing the gate structures down to (i.e., stopping on) a top surface of the gate electrodes, in accordance with one or more aspects of the present invention.

FIG. 7 depicts one example of the structure of FIG. 1 after recessing 150 the gate structures 108 down to (i.e., stopping on) a top surface of the gate electrodes 110, in accordance with one or more aspects of the present invention.

Figure 8:
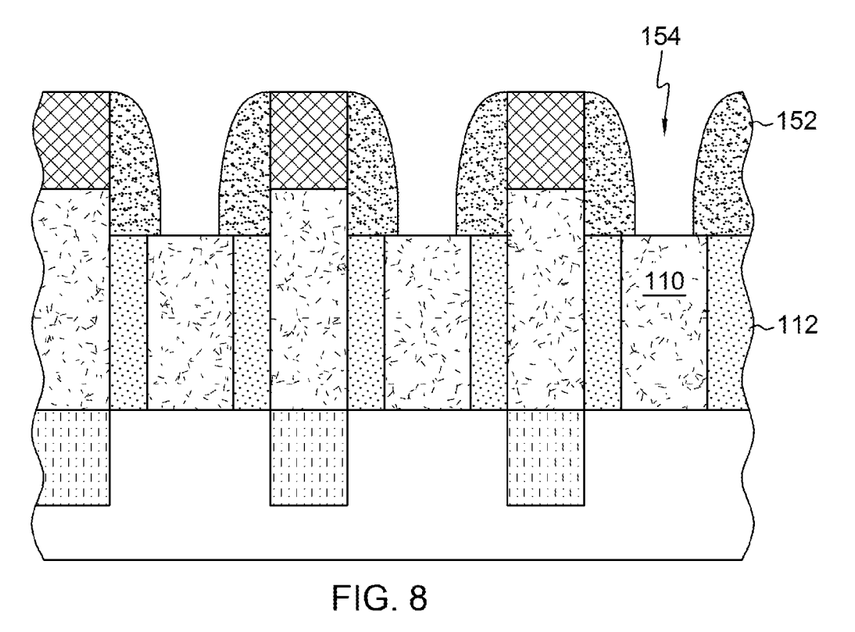
FIG. 8 depicts one example of the structure of FIG. 7 after forming inner spacers similar to that of FIG. 4 using, for example, a process similar to that described with regard to FIGS. 3 and 4, resulting in gate contact openings above the gate electrodes, in accordance with one or more aspects of the present invention.

FIG. 8 depicts one example of the structure of FIG. 7 after forming inner spacers 152 similar to that of FIG. 4 using, for example, a process similar to that described with regard to FIGS. 3 and 4, resulting in gate contact openings 154 above the gate electrodes 110, in accordance with one or more aspects of the present invention.

Figure 9:
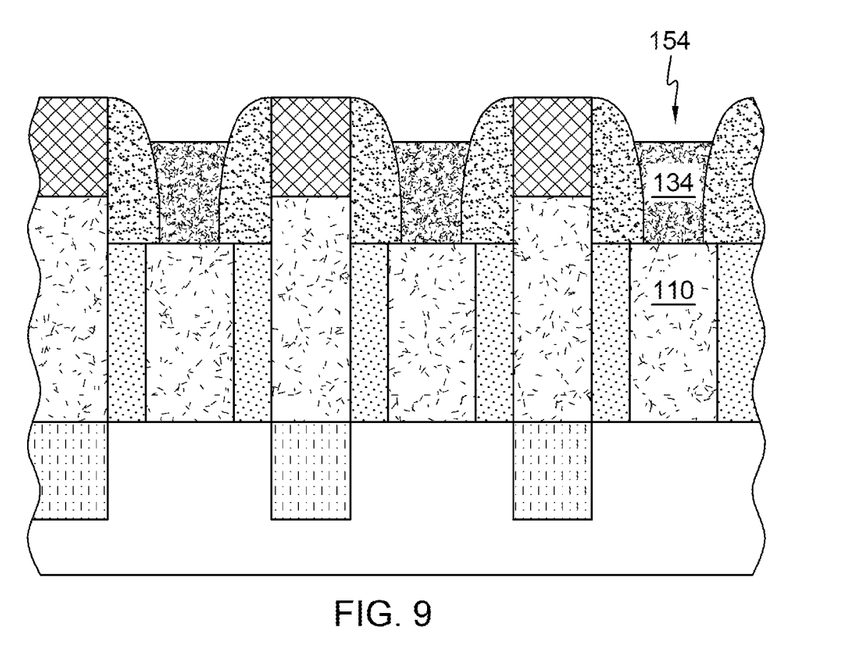
FIG. 9 depicts one example of the structure of FIG. 8 after partially filling the gate contact openings with metal, in accordance with one or more aspects of the present invention.

FIG. 9 depicts one example of the structure of FIG. 8 after partially filling the gate contact openings 154 with metal 134, in accordance with one or more aspects of the present invention.

Figure 10:
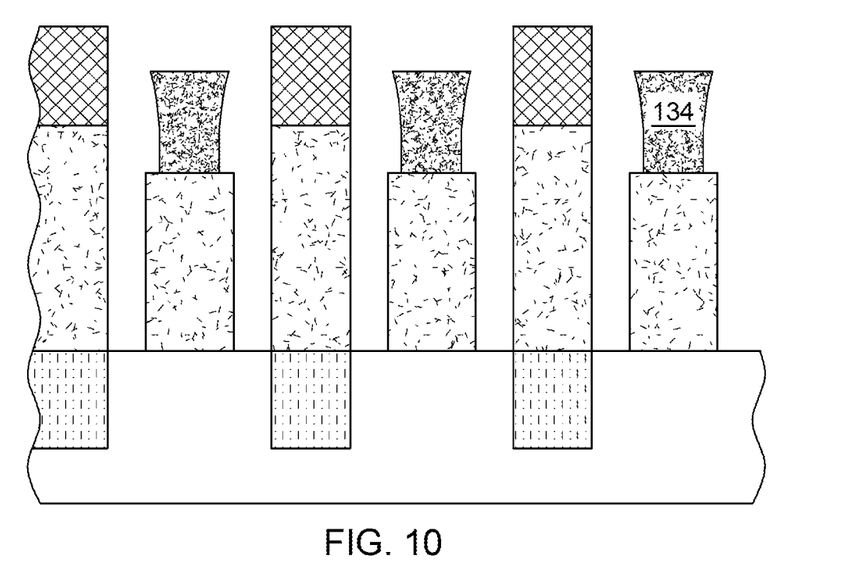
FIG. 10 depicts one example of the structure of FIG. 9 after removing all spacers (FIG. 8) from the gate structures and leaving the metal formed with the inner spacers, in accordance with one or more aspects of the present invention.

FIG. 10 depicts one example of the structure of FIG. 9 after removing all spacers (112 and 152, FIG. 8) from the gate structures and leaving the metal 134 formed with the inner spacers, in accordance with one or more aspects of the present invention.

Figure 11:
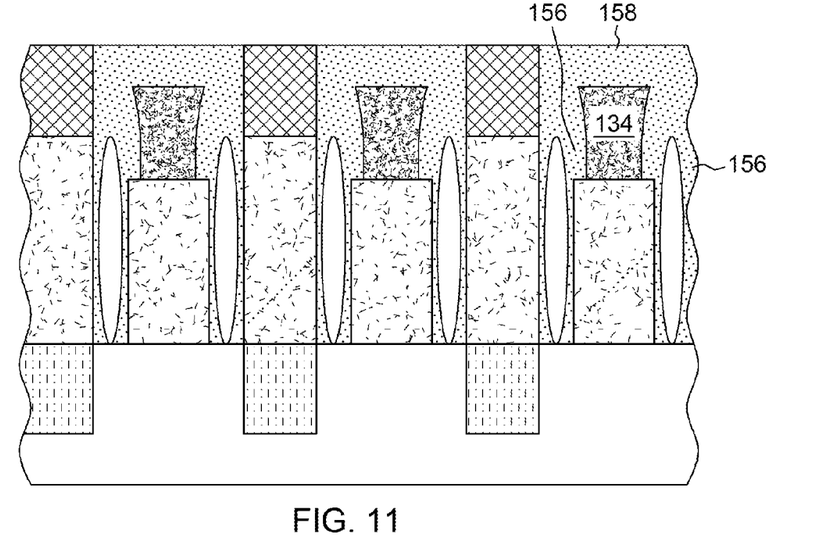
FIG. 11 depicts one example of the structure of FIG. 10 after forming air-gap spacers adjacent opposite sidewalls of the gate electrodes and metal, forming gate caps and planarizing the structure, in accordance with one or more aspects of the present invention.

FIG. 11 depicts one example of the structure of FIG. 10 after forming air-gap spacers 156 adjacent opposite sidewalls of the gate electrodes 110 and metal 134, forming gate caps 158 and planarizing the structure, in accordance with one or more aspects of the present invention.

Figure 12:
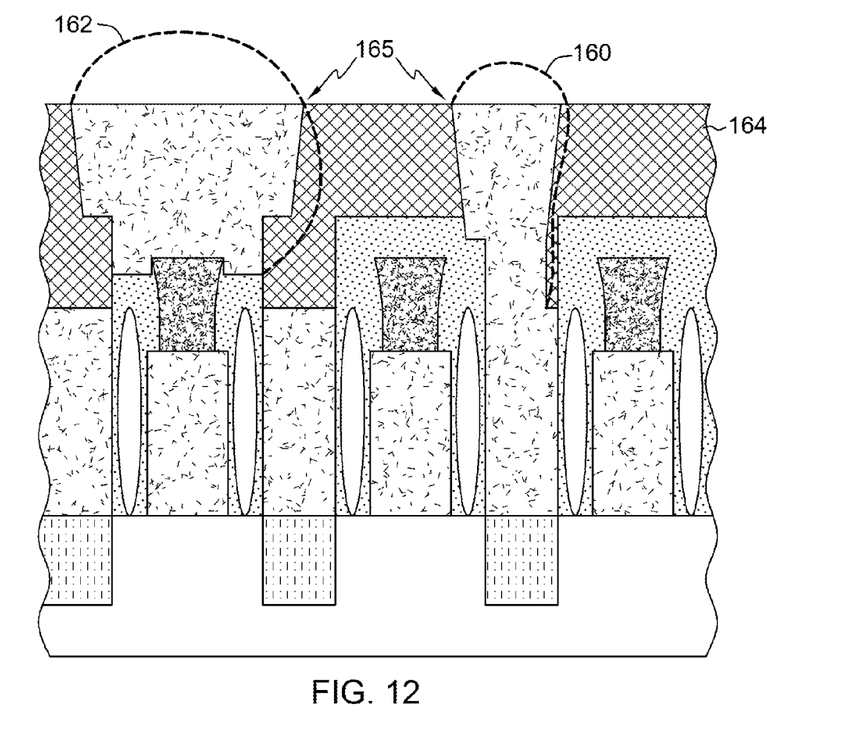
FIG. 12 depicts one example of the structure of FIG. 11 after forming a dielectric layer over the planarized structure, removing portions of the dielectric layer forming contact openings, forming source/drain contacts and gate contacts and planarizing the structure, in accordance with one or more aspects of the present invention.

FIG. 12 depicts one example of the structure of FIG. 11 after forming a dielectric layer 164 over the planarized structure, removing portions of the dielectric layer forming contact openings 165, forming source/drain contacts 160 and gate contacts 162 and planarizing the structure, in accordance with one or more aspects of the present invention.

In one example, different etch processes are used for upper source/drain contacts 160 and gate contact(s) 162. For example, the source/drain contacts may be formed using an etching process for dielectric layer 164, exposing the lower source/drain contacts (FIG. 1, 116) and stopping on a top surface of the lower source/drain contacts. The gate contact(s) may be realized by, for example, using a selective gate cap open process that does not damage the dielectric caps (FIG. 1, 118) over the lower source/drain contacts. This prevent an electrical short between the gate contact and the bottom source/drain contact. The upper source/drain contact openings may be realized using, for example, a selective etch process for the openings in dielectric layer 164 and the lower source/drain contacts, selective to the material(s) of the gate cap(s) and spacers (e.g., SiN). Note also, that the benefits of using the selective growth for metal 134 described with respect to FIG. 6 also apply to FIG. 12.

It should also be noted that, while (upper) gate contact 162 requires a patterning/mask process, metal 134 above the gate electrode(s) (serves as a lower gate contact) covers much of the surface of the gate electrode(s) without the need for a patterning/mask process.

In a first aspect, disclosed above is a method. The method includes providing a starting semiconductor structure, the starting semiconductor structure including a semiconductor substrate, a fin on the substrate, an active region having a source/drain pair with a channel region therebetween, a lower contact portion above a source and a drain of the source/drain pair, and a gate electrode over the channel region. The method further includes forming an air-gap spacer pair adjacent opposite sidewalls of the gate electrode, forming a lower gate contact over the gate electrode, and forming an upper gate contact over the lower gate contact, the upper gate contact being situated above the active region.

In one example, the air-gap spacer pair may be, for example, formed prior to the lower gate contact. In one example, the starting semiconductor structure may include, for example, a gate structure, the gate structure including the gate electrode and lower spacer portions adjacent opposite sidewalls of the gate electrode. In one example, forming the air-gap spacer pair may include, for example, forming the air-gap spacer pair over the lower spacer portions, the air-gap spacer pair extending to a height of the gate electrode. In one example, forming the lower gate contact may include, for example, forming an upwardly tapered top spacer pair over the air-gap spacer pair, resulting in a tapered gate contact opening, and forming the lower gate contact in the tapered gate contact opening. In one example, forming the upper gate contact may include forming a dielectric layer over the structure after forming the lower gate contact, removing portions of the dielectric layer above the active region to expose the lower gate contact, resulting in an upper gate contact opening, and filling the upper gate contact opening with metal. In one example, the lower contact portion for each source and each drain may have, for example, a dielectric cap thereon, and exposing the lower gate contact includes etching the dielectric layer over the structure selective to the dielectric cap.

In one example, forming the lower gate contact in the method of the first aspect may be, for example, formed prior to the air-gap spacer pair. In one example, the starting semiconductor structure may further include, for example, a spacer pair adjacent opposite sidewalls of the gate electrode, the spacer pair extending to a height of the gate electrode, the method further including forming an upwardly tapered top spacer pair over the spacer pair, resulting in a lower gate contact opening, and forming the lower gate contact in the lower gate contact opening. In one example, forming the air-gap spacer pair may include, for example, removing the upwardly tapered top spacer pair and the spacer pair thereunder, resulting in a spacer pair opening adjacent the opposite sidewalls of the gate electrode and opposite sidewalls of the lower gate contact, and forming the pair of air-gap spacers in the spacer pair opening. In one example, forming the upper gate contact may include, for example, forming a dielectric layer above the structure with the pair of air-gap spacers, removing a portion of the dielectric layer above the active region, exposing the lower gate contact and the air-gap spacer pair, resulting in an upper gate contact opening, and filling the upper gate contact opening with metal.

In one example, forming the lower gate contact in the method of the first aspect may be accomplished, for example, without using a mask.

In a second aspect, disclosed above is a semiconductor structure. The semiconductor structure includes a semiconductor substrate, a semiconductor fin on the semiconductor substrate, a transistor integrated with the semiconductor fin at a top portion thereof, the transistor including an active region including a source, a drain and a channel region therebetween. The semiconductor structure further includes a gate structure over the channel region, the gate structure including a gate electrode, an air-gap spacer pair adjacent opposite sidewalls of the gate electrode, and a gate contact for the gate electrode.

In one example, the gate contact may include, for example, a lower gate contact portion and an upper gate contact portion. In one example, an air gap of the air-gap spacer pair may, for example, span less than a height of the gate electrode. In another example, an air gap of the air-gap spacer pair may, for example, span more than a height of the gate electrode.

In one example, the semiconductor structure having upper and lower gate contact portions may further include, for example, a lower source/drain contact portion above each of the source and the drain, each source/drain contact portion being adjacent an air gap of the air-gap spacer pair. In one example, the semiconductor structure may further include, for example, an upper source/drain contact portion above each lower source/drain contact portion. In another example, the semiconductor structure may further include, for example, a dielectric cap above each lower source/drain contact portion.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method comprising:
providing a starting semiconductor structure, the starting semiconductor structure comprising a semiconductor substrate, a fin on the semiconductor substrate, an active region having a source/drain pair with a channel region therebetween, a lower contact portion above a source and a drain of the source/drain pair, and a gate electrode over the channel region;
forming an air-gap spacer pair adjacent opposite sidewalls of the gate electrode, wherein each air-gap spacer of the air-gap spacer pair comprises an air gap that is surrounded on all sides, top and bottom by a same spacer material;
forming a lower gate contact over the gate electrode after forming the air-gap spacer pair; and
forming an upper gate contact over the lower gate contact, the upper gate contact being situated above the active region.

2. The method of claim 1, wherein the starting semiconductor structure comprises a gate structure, the gate structure comprising the gate electrode and lower spacer portions adjacent opposite sidewalls of the gate electrode.

3. The method of claim 2, wherein forming the air-gap spacer pair comprises:
forming the air-gap spacer pair over the lower spacer portions, the air-gap spacer pair extending to a height of the gate electrode.

4. The method of claim 3, wherein forming the lower gate contact comprises:
forming an upwardly tapered top spacer pair over the air-gap spacer pair, resulting in a tapered gate contact opening; and
forming the lower gate contact in the tapered gate contact opening.

5. The method of claim 4, wherein forming the upper gate contact comprises:
forming a dielectric layer over the starting semiconductor structure after forming the lower gate contact;

removing portions of the dielectric layer above the active region to expose the lower gate contact, resulting in an upper gate contact opening; and filling the upper gate contact opening with metal.

6. The method of claim 5, wherein the lower contact portion for each source and each drain has a dielectric cap thereon, and exposing the lower gate contact comprises:

etching the dielectric layer over the structure selective to the dielectric cap.

7. The method of claim 1, wherein forming the lower gate contact is accomplished without a mask.

8. A semiconductor structure comprising:

a semiconductor substrate;

a semiconductor fin on the semiconductor substrate;

a transistor integrated with the semiconductor fin at a top portion thereof, the transistor comprising:

an active region comprising a source, a drain, and a channel region between the source and the drain;

a gate structure over the channel region, the gate structure comprising a gate electrode, an air-gap spacer pair adjacent opposite sidewalls of the gate electrode, each air-gap spacer of the air-gap spacer pair including an air gap that is surrounded on all sides, top and bottom by a same spacer material; and a first lower source/drain contact disposed upon the source and a second lower source/drain contact disposed upon the drain, the first lower source/drain contact and the second lower source/drain contact each having a height extending above a height of the gate electrode; and a gate contact for the gate electrode, the gate contact including a lower gate contact portion and an upper gate contact portion, and the lower gate contact portion having a height extending above the height of the first lower source/drain contact and the second lower source/drain contact, wherein the upper gate contact portion includes a lower surface that is arranged over a top surface of each air-gap spacer in the air-gap spacer pair.

9. The semiconductor structure of claim 8, wherein the air gap of each air-gap spacer of the air-gap spacer pair spans less than the height of the gate electrode.

10. The semiconductor structure of claim 8, wherein the air gap of each air-gap spacer the air-gap spacer pair spans more than the height of the gate electrode.

11. The semiconductor structure of claim 8, wherein the first lower source/drain contact and the second lower source/drain contact are respectively adjacent to the air gap of one of the air-gap spacers of the air-gap spacer pair.

12. The semiconductor structure of claim 11, further comprising:

a first upper source/drain contact above the first lower source/drain contact; and a second upper source/drain contact above the second lower source/drain contact.

13. The semiconductor structure of claim 11, further comprising:

a first dielectric cap above the first lower source/drain contact; and a second dielectric cap above the second lower source/drain contact.

* * * * *